United States Patent
Kobayashi

(10) Patent No.: US 12,242,240 B2
(45) Date of Patent: Mar. 4, 2025

(54) SERVER DEVICE AND PROGRAM

(71) Applicant: KOBAYASHI MANUFACTURE CO., LTD., Hakusan (JP)

(72) Inventor: Yasunori Kobayashi, Hakusan (JP)

(73) Assignee: KOBAYASHI MANUFACTURE CO., LTD., Hakusan (JP)

( * ) Notice: Subject to any disclaimer, the term of this patent is extended or adjusted under 35 U.S.C. 154(b) by 0 days.

(21) Appl. No.: 18/285,716

(22) PCT Filed: Apr. 15, 2021

(86) PCT No.: PCT/JP2021/015568
§ 371 (c)(1),
(2) Date: Oct. 5, 2023

(87) PCT Pub. No.: WO2022/219777
PCT Pub. Date: Oct. 20, 2022

(65) Prior Publication Data
US 2024/0085880 A1     Mar. 14, 2024

(51) Int. Cl.
| G06Q 30/0283 | (2023.01) |
| G05B 19/4097 | (2006.01) |
| G06F 30/10 | (2020.01) |
| G06Q 10/0631 | (2023.01) |

(52) U.S. Cl.
CPC ......... *G05B 19/4097* (2013.01); *G06F 30/10* (2020.01); *G06Q 10/06313* (2013.01); *G05B 2219/35431* (2013.01)

(58) Field of Classification Search
CPC ..... G05B 19/4097; G06F 30/10; G06F 30/12; G06F 30/13; G06Q 10/06313
USPC .................. 705/7.35, 400, 7.23
See application file for complete search history.

(56) References Cited

U.S. PATENT DOCUMENTS

| 8,725,282 B2 | 5/2014 | Ishii et al. |
| 11,113,432 B2* | 9/2021 | Principato ............ G06K 7/1417 |
| 2010/0283170 A1* | 11/2010 | Huang ................ B29C 33/3835 |
| | | 264/219 |
| 2012/0109587 A1 | 5/2012 | Ishi et al. |
| 2017/0220835 A1* | 8/2017 | Glazberg ......... G06K 19/06028 |
| 2022/0261723 A1* | 8/2022 | King ................ G06Q 10/06313 |

FOREIGN PATENT DOCUMENTS

| CN | 104715344 A | 6/2015 |
| CN | 110766477 A | 2/2020 |
| JP | H07-175859 A | 7/1995 |

(Continued)

OTHER PUBLICATIONS

Peddireddy et al., "Identifying manufacturability and machining processes using deep 3D convolutional networks", Journal of Manufacturing Processes: vol. 64, Apr. 2021, pp. 1336-1348. (Year: 2021).*

(Continued)

*Primary Examiner* — Daniel Vetter
*Assistant Examiner* — Freda A Nelson
(74) *Attorney, Agent, or Firm* — Oliff PLC

(57) ABSTRACT

A server device includes: an acquiring device a drawing to be used in estimation related to work for producing a product; a processing device processing the drawing such that an object indicating content of work to be performed in a work process for producing the product is displayed on the drawing; and an output device outputting the processed drawing to a terminal device.

9 Claims, 9 Drawing Sheets

(56) References Cited

FOREIGN PATENT DOCUMENTS

| | | |
|---|---|---|
| JP | 2001-249985 A | 9/2001 |
| JP | 2002-006922 A | 1/2002 |
| JP | 2002-182733 A | 6/2002 |
| JP | 2002-259500 A | 9/2002 |
| JP | 2006-244384 A | 9/2006 |
| JP | 2013-246487 A | 12/2013 |
| JP | 2020-166382 A | 10/2020 |
| TW | I232385 B | 5/2005 |
| WO | 2019/082429 A1 | 5/2019 |

OTHER PUBLICATIONS

Szekely, Pedro, "Template-Based Mapping of Application Data to Interactive Displays", Oct. 3-5, 1990, Proceedings of the 3rd Annual ACM Symposium on User Interface Software and Technology, UIST 1990, Snowbird, Utah, USA, 10 pages (Year: 1990).*
Jul. 6, 2021 International Search Report issued in International Patent Application No. PCT/JP2021/015568.
Jul. 6, 2021 Written Opinion issued in International Patent Application No. PCT/JP2021/015568.
Dec. 28, 2022 Office Action issued in Taiwanese Patent Application No. 111113613.
Aug. 23, 2022 Decision to grant a patent in Japanese Patent Application No. 2022-535906.
May 30, 2024 Office Action issued in Chinese Patent Application No. 202180096573.7.
Oct. 30, 2024 Office Action issued in Chinese Patent Application No. 202180096573.7.

* cited by examiner

| ORDER NUMBER | SERIAL NUMBER | DRAWING NUMBER | ORDER INFORMATION | | ... | PRODUCT NAME | QUAN-TITY | MATERIAL INFORMA-TION | PRO-CESSING INFORMA-TION | WORK PRO-CESS | ESTIMATED NUMBER OF MAN-HOURS | ESTIMATED AMOUNT (YEN) | ... |
| --- | --- | --- | --- | --- | --- | --- | --- | --- | --- | --- | --- | --- | --- |
| | | | CLIENT NAME | DELIVERY DATE | | | | | | | | | |
| 001 | 101 | 201 | CLIENT X | 20XX/12/20 | ... | SHEET METAL PRODUCT O | 4 | ... | ... | ... | 15 | 30,000 | ... |
| 002 | 102 | 202 | CLIENT Y | 20XX/12/25 | ... | SHEET METAL PRODUCT P | 1 | ... | ... | ... | 10 | ... | ... |
| ... | ... | ... | ... | ... | | ... | ... | ... | ... | ... | ... | ... | |

| SERIAL NUMBER | DRAWING NUMBER | WORK TYPE | OPERATOR NAME | SCHEDULED START DATE AND TIME | SCHEDULED END DATE AND TIME | SCHEDULED NUMBER OF MAN-HOURS | START DATE AND TIME | END DATE AND TIME | ACTUAL NUMBER OF MAN-HOURS | ... |
|---|---|---|---|---|---|---|---|---|---|---|
| 101 | 201 | WELDING | OPERATOR A | 20XX/12/10 10:00 | 20XX/12/10 10:07 | 7 | 20XX/12/10 10:10 | 20XX/12/10 10:16 | 6 | ... |
| 102 | 202 | ... | ... | 20XX/12/10 13:00 | 20XX/12/10 13:05 | 4 | ... | ... | ... | ... |
| ... | ... | ... | ... | ... | ... | ... | 20XX/12/10 13:00 | 20XX/12/10 13:05 | 5 | ... |
| | | | | | | | 20XX/12/10 13:00 | 20XX/12/10 13:05 | 5 | ... |

SERVER DEVICE AND PROGRAM

TECHNICAL FIELD

The present invention relates to a technology for assisting an operator in work for producing a product.

BACKGROUND ART

A technology for estimation associated with work for producing a product based on a drawing is known. For example, Patent Document 1 describes a technology for generating a drawing for estimating the component cost based on a design drawing and estimating the component cost based on the generated drawing.

CITATION LIST

Patent Document

Patent Document 1: JP 2013-246487A

SUMMARY OF INVENTION

Technical Problem

Commonly, a drawing for estimation is not used for purposes other than estimation. It is desired that the drawing for estimation can be used for purposes other than estimation. Meanwhile, operators in a workplace basically perform the work for producing a product based on a production drawing. However, it may take time for each operator to understand a portion that the operator is to work on and the work content simply by looking at the production drawing. In order to allow each operator to easily understand the work content, for example, it is conceivable to create written operation instructions separate from the production drawing. However, in this case, creating the written work instructions will take time and effort.

One object of the present invention is to enable operators to more easily understand the work content by effectively using a drawing for estimation.

Solution to Problem

One aspect of the present invention provides a server device including; an acquiring means for acquiring a drawing to be used in estimation related to work for producing a product; a processing means for processing the drawing such that an object indicating content of work to be performed in a work process for producing the product is displayed on the drawing; and an output means for outputting the processed drawing to a terminal device.

The object may indicate a portion to be subjected to the work.

The object may have an appearance that is different depending on a type of the work.

The drawing may include a layer corresponding to a work process, and the layer may include an object indicating content of work to be performed in the work process.

The output means may output a drawing obtained by superimposing, on the acquired drawing, the layer including the object indicating the content of the work to be performed in the work process, to a terminal device corresponding to the work process out of a plurality of terminal devices.

The server device may further include a generating means for generating an encoded image indicating an identifier that uniquely identifies production of the product, wherein, upon the encoded image being read by a reader device, the output means may output the processed drawing to the terminal device.

The server device may further include a storage control means for storing, in a storage unit, at least one of start date and time of the work and end date and time of the work, based on date and time when the encoded image is read by the reader device.

Another aspect of the present invention provides a program for causing a computer to execute: a step of acquiring a drawing to be used in estimation related to work for producing a product; a step of processing the drawing such that an object indicating content of work to be performed in a work process for producing the product is displayed on the drawing; and a step of outputting the processed drawing to a terminal device.

Effects of Invention

According to the present invention, operators can more easily understand the work content by effectively using a drawing for estimation.

BRIEF DESCRIPTION OF DRAWINGS

FIG. 3 shows an example of an estimation management table.

FIG. 4 shows an example of a schedule management table.

DESCRIPTION OF EMBODIMENTS

Figure 1:
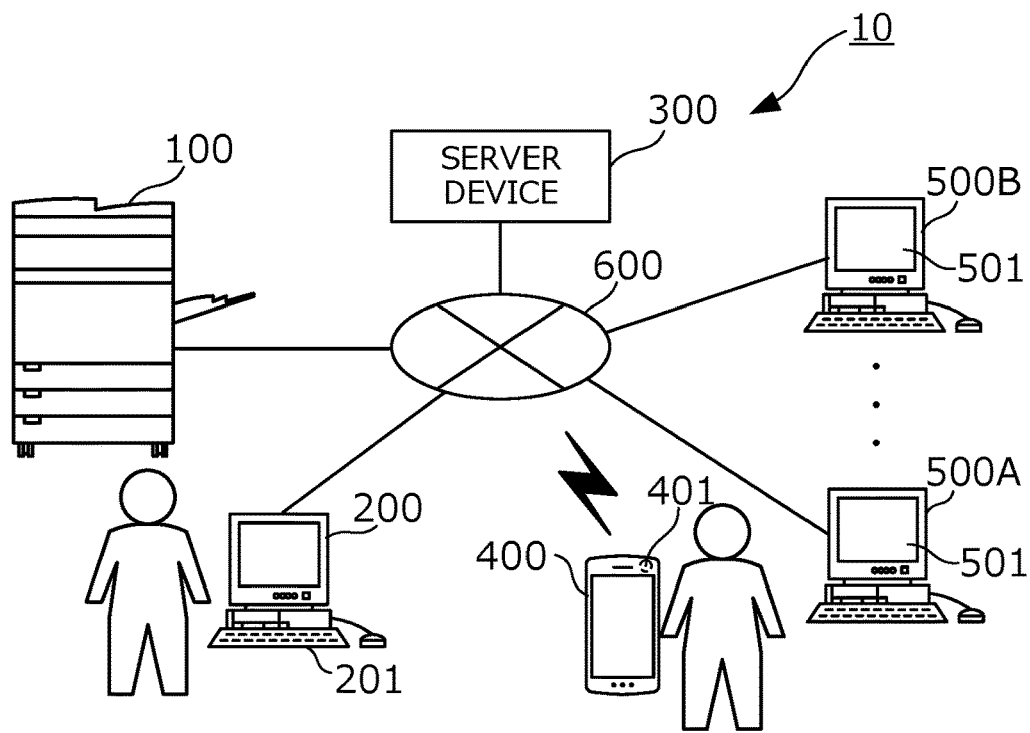
FIG. 1 shows an example of an estimation system according to an embodiment.

FIG. 1 shows an example of estimation system 10 according to an embodiment. Estimation system 10 creates an estimation related to production of a product and assists an operator (a worker) in work for producing the product. The "product" here refers to an article to be produced. The "product" includes not only the article but also components of the article. Estimation system 10 is used in a factory for producing a sheet metal product, for example. Processes of producing the sheet metal product include a plurality of work processes, such as an order-accepting process, a bending process, and a welding process.

Estimation system 10 includes: image processing device 100, input terminal 200, server device 300, user terminal 400, and work terminals 500A, . . . , 500B (which are also collectively referred to as "work terminal(s) 500"). These devices are connected to each other via network 600, which is a LAN (Local Area Network) or the like.

Image processing device 100 is used to read a drawing received from a client (hereinafter referred to as a "client drawing") by an operator in charge of the order-accepting process. Image processing device 100 is a multi-functional device with functions of a printer, an image scanner, or the like, for example. A drawing to be used in estimation associated with the work for producing a product (hereinafter referred to as an "estimation drawing") is generated based on the client drawing.

Input terminal 200 is used by the operator in charge of the order-accepting process to input estimation information to server device 300. Input terminal 200 is, for example, a computer such as a personal computer. Input terminal 200 includes an operation unit 201 with a keyboard, a mouse, a hardware button, a touch sensor, or the like, and accepts operations made by the operator.

Server device 300 manages information regarding accepted orders and production. Server device 300 also serves to create an estimation based on the estimation drawing and order information and process the estimation drawing such that the work content is displayed on the estimation drawing.

After the order-accepting is complete, a set of the material of the product, an item tag, and a production drawing is carried to a work site where the work for producing the product is performed. The item tag includes an encoded image indicating a serial number of the product. The encoded image is an image obtained by encoding information. The encoded image includes, for example, a bar code or a two-dimensional code. Note that the encoded image is not limited to a bar code or a two-dimensional code, and may be any type of image obtained by encoding information.

User terminal 400 is used to read the encoded image associated with work for producing the product when each operator who performs the work begins the work. By reading the encoded image, it is recognized that the operator begins the work. User terminal 400 is, for example, a smartphone that is carried and used by the operator. User terminal 400 includes image capture unit 401, which is a digital camera or the like, and reads the encoded image captured by image capture unit 401. User terminal 400 is an example of a "reader device" according to the present invention.

Each work terminal 500 is used to display the estimation drawing associated with the work for producing the product when an operator performs the work. The estimation drawing shows the work content. Thus, the operator can easily understand the work content by looking at the estimation drawing displayed on work terminal 500. The plurality of work terminals 500 are installed in work sites where different work processes are performed. For example, work terminal 500A is installed in a work site where the welding process is performed. work terminals 500B are installed in a work site where the bending process is performed. Work terminals 500 are, for example, computers such as personal computers. Each work terminal 500 includes display unit 501, which is a liquid-crystal display, an organic EL (Electro Luminescence) display, or the like, and displays the estimation drawing. Work terminal 500 is an example of a "terminal device" according to the present invention.

Figure 2:
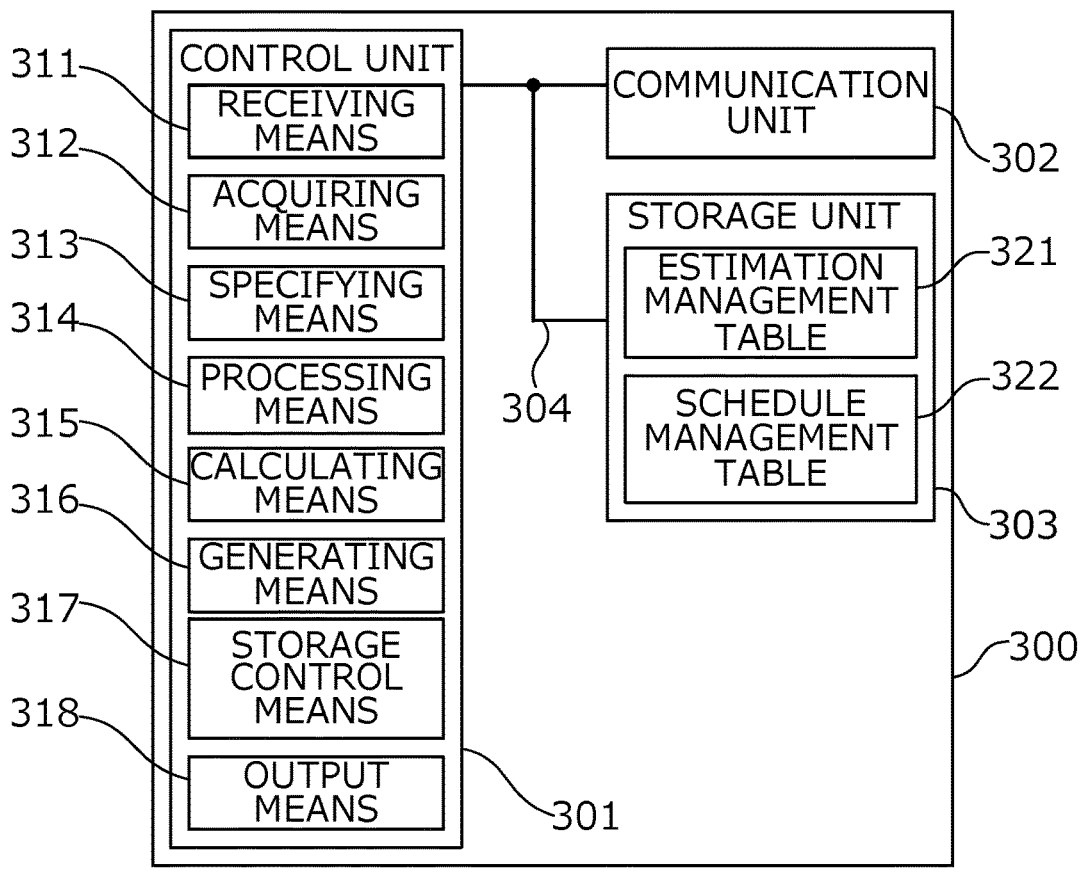
FIG. 2 shows an example of a configuration of a server device.

FIG. 2 shows an example of a configuration of server device 300. Server device 300 includes control unit 301, communication unit 302, and storage unit 303. These constituent units are connected to each other via bus 304. Control unit 301 is also called a processor and configured to control each unit of server device 300 and perform various types of processing. Control unit 301 includes a CPU (Central Processing Unit), for example. Storage unit 303 is also called a memory and stores various data and programs. Storage unit 303 includes, for example, at least one of a ROM (Read Only Memory), a RAM (Random Access Memory), an HDD (Hard Disk Drive), and a SSD (Solid State Drive). Communication unit 302 is a communication interface for connecting server device 300 to network 600. Communication unit 302 is used to communicate with other devices connected via network 600. A program for realizing the functions of server device 300 is stored in storage unit 303. Also, estimation management table 321 and schedule management table 322 are stored in the storage unit 303.

FIG. 3 shows an example of estimation management table 321. Estimation management table 321 includes an order number, a serial number, a drawing number, order information, a product name, quantity, material information, processing information, work processes, an estimated number of man-hours, and an estimated amount. The order number is an identifier that uniquely identifies an order from a client. The serial number is an identifier that uniquely identifies production of the product ordered by the client. The drawing number is an identifier that uniquely identifies a drawing of the product ordered by a client. The order information is information regarding the order from the client. The order information includes a client name and a delivery date. The client name is the name of the client that placed the order. The delivery date is the due date when the product that the client ordered production thereof is to be delivered. The product name is the name of the product that the client ordered production thereof. The quantity is the number of products that the client ordered production thereof. The material information is information regarding the material of the product ordered by the client. The processing information is information indicating processing necessary for producing the product ordered by the client. The work processes are information indicating processes of the work necessary for producing the product ordered by the client. The estimated number of man-hours is the time estimated to be required for the work for producing the product in accordance with the order from the client. The estimated amount is an amount estimated to be required for the work for producing the product in accordance with the order from the client.

FIG. 4 shows an example of schedule management table 322. Schedule management table 322 includes a serial number, a drawing number, a work type, an operator name, scheduled start date and time, scheduled end date and time, scheduled number of man-hours, start date and time, end date and time, and actual number of man-hours. The serial number and the drawing number are the same as those included in estimation management table 321. The work type is information that uniquely identifies a work type. The operator name is the name of an operator that performs the work for producing the product. The operator is pre-assigned, for example, based on the workload and capabilities of each operator. The scheduled start date and time is the date and time when the work for producing a product is scheduled to start. The scheduled end date and time is the date and time when the work for producing a product is scheduled to end. The scheduled start date and time and the scheduled end date and time are predetermined in accordance with the schedule and work content of the operator. The scheduled number of man-hours is the number of days and hours that are to be required for work. The scheduled number of man-hours may be the estimated number of man-hours included in the estimation management table 321. The start date and time is the date and time when the work for producing a product actually starts. The end date and time is the date and time when the work for producing a product actually ends. The actual number of man-hours is the number of days and hours that are actually required for the work for producing the product.

Returning to FIG. 2, control unit 301 functions as receiving means 311, acquiring means 312, specifying means 313, processing means 314, calculating means 315, generating means 316, storage control means 317, and output means 318. These functions are realized by control unit 301 executing the program stored in storage unit 303 to perform calculation or control each unit of server device 300.

Receiving means 311 receives a client drawing from image processing device 100. Acquiring means 312 generates and acquires an estimation drawing based on the client drawing received by receiving means 311. Specifying means 313 identifies work elements for produce the product, based on the client drawing received by receiving means 311. Processing means 314 processes the estimation drawing acquired by acquiring means 312 such that an object indicating the content of work to be performed in each work process to produce the product is displayed on the estimation drawing, based on the work elements specified by specifying means 313. The "object" here refers to a virtual object indicated by a figure or an image. The "processing" here refers to modifying the estimation drawing. Calculating means 315 calculates an estimated number of man-hours and an estimated amount for the work for producing the product, based on the estimation drawing processed by processing means 314. Generating means 316 generates an encoded image, which indicates the drawing number of the estimation drawing processed by processing means 314. Storage control means 317 stores the estimated number of man-hours and the estimated amount calculated by calculating means 315 in estimation management table 321. Storage control means 317 also stores the start date and time and the end date and time of the work associated with the encoded image in schedule management table 322, based on the date and time when the encoded image generated by generating means 316 is read by user terminal 400. Output means 318 outputs the estimation drawing processed by processing means 314 to work terminals 500.

Similar to server device 300, each of image processing device 100, input terminal 200, user terminal 400, and work terminals 500 also has a control unit, a communication unit, and a storage unit. The functions of each of these devices are also realized by the control unit executing the program stored in the storage unit to perform calculation or control each unit of the device. In the following description, when any of these devices are described as a subject of operation, it means that the operation of the device is performed by the control unit executing a program stored in the storage unit.

Figure 5:
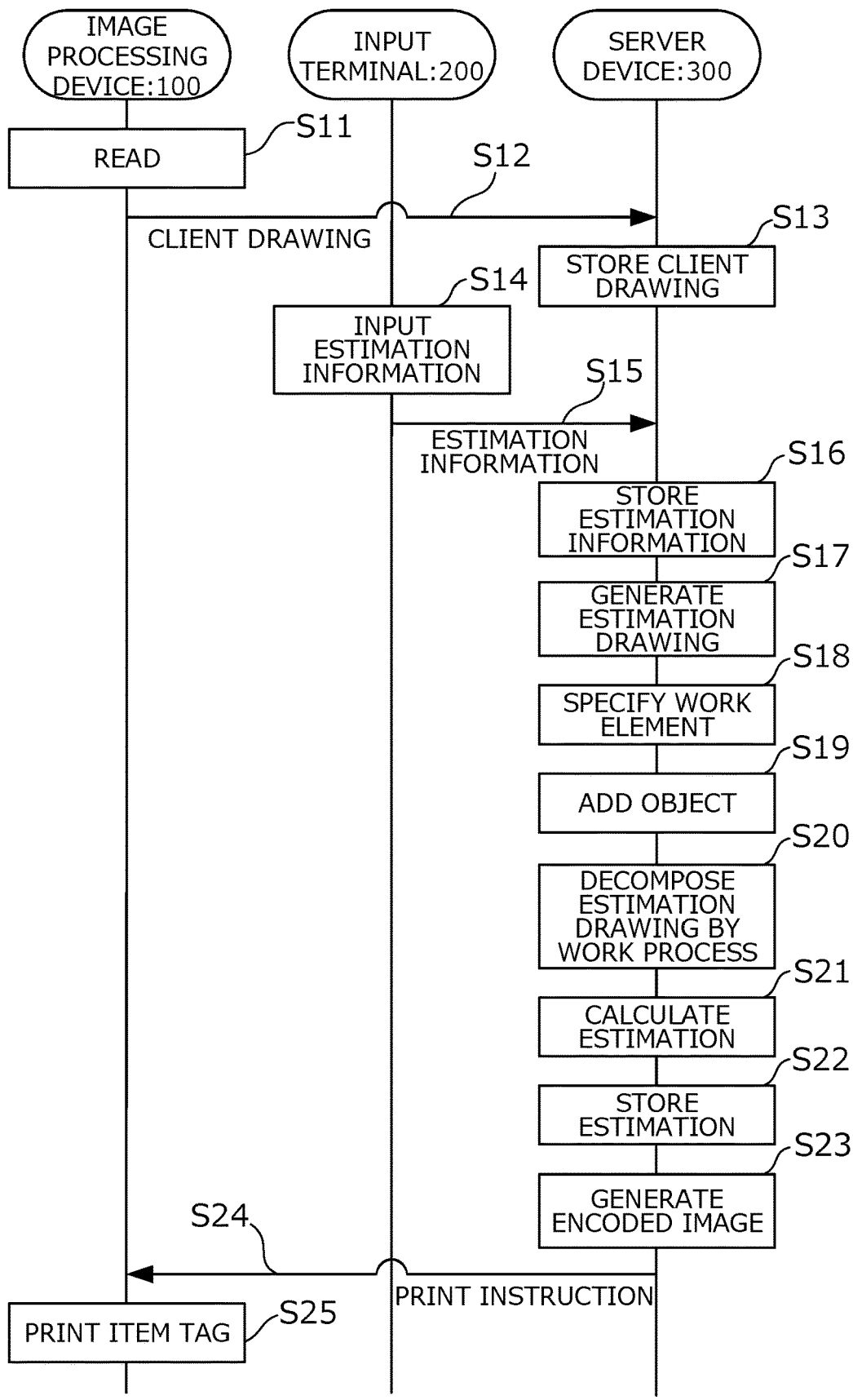
FIG. 5 is a sequence chart showing an example of operation performed during estimation.

FIG. 5 is a sequence chart showing an example of operation performed by estimation system 10 when creating an estimate. To create an estimate, first, estimation system 10 receives a client drawing from a client. The client drawing is, for example, a two-dimensional drawing. In step S11, image processing device 100 reads the client drawing and converts the read client drawing to a drawing in a digital format. Here, image processing device 100 may apply OCR (Optical Character Recognition) processing to the client drawing in order to recognize characters contained in client drawing.

Figure 6:
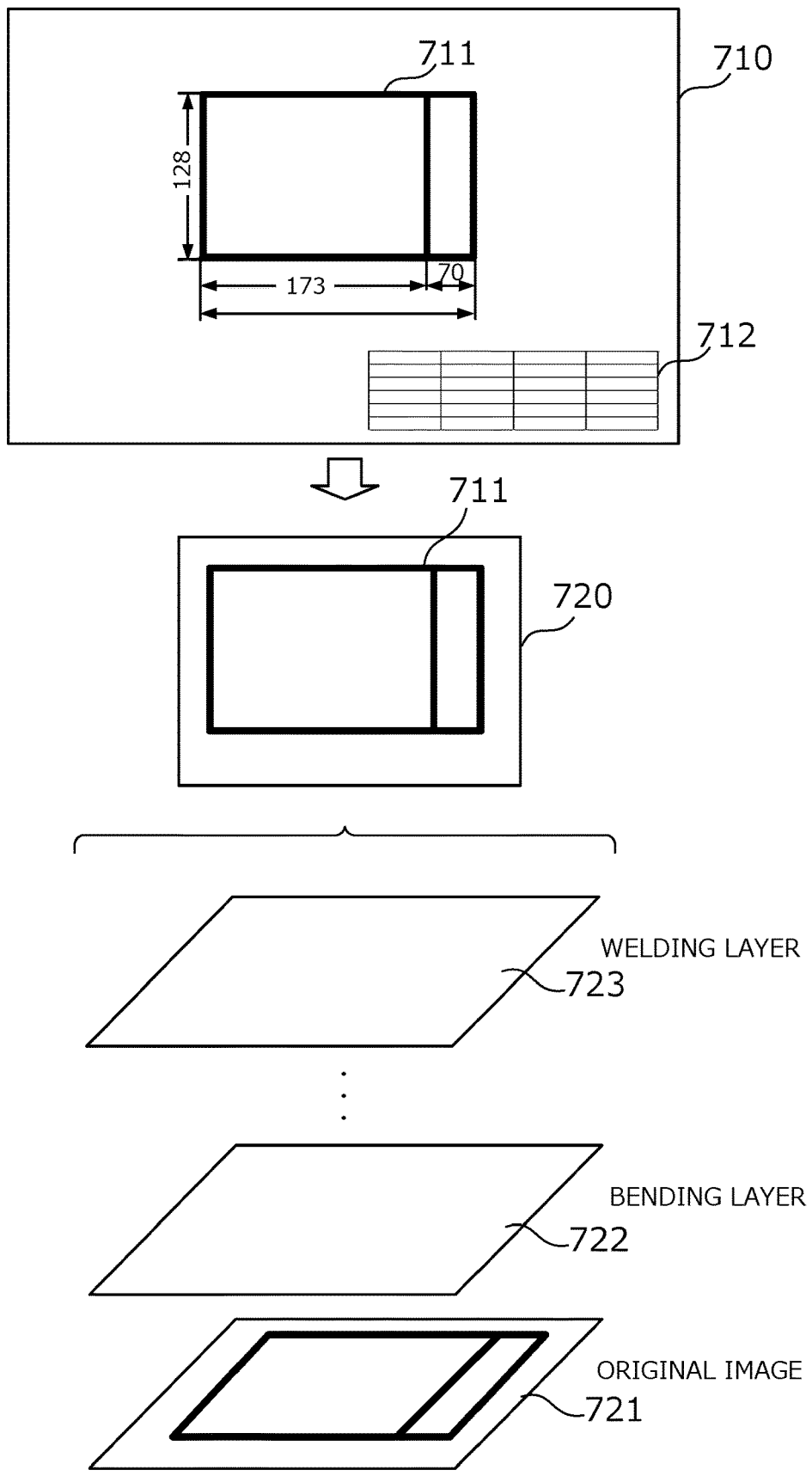
FIG. 6 shows an example of a drawing.

FIG. 6 shows an example of the drawing. Client drawing 710 shown in FIG. 6 includes FIG. 711 and production information 712. FIG. 711 includes at least one of the following views of the product: a front view, a back view, a left side view, a right side view, a plan view, a bottom view, a cross-sectional view, and a geometry net. Production information 712 includes, for example, a product name, material information such as a material and a thickness of the product, processing information regarding processing such as bending, welding, and deburring, order information such as a client name, a department name, order date, and delivery date, a drawing scale, and standard information regarding surface treatment and heat treatment. Note that production information 712 need not be written in letters, and may alternatively be represented by manufacturing symbols or figures representing processing information, or dimension lines or dimension values representing the dimensions.

Returning to FIG. 5, in step S12, image processing device 100 transmits the client drawing read in step S11 to server device 300. In step S13, storage control means 317 of server device 300 assigns a drawing number to the client drawing received from image processing device 100 and stores this client drawing in storage unit 303.

In step S14, the operator uses operation unit 201 of input terminal 200 to select a target client drawing from client drawings stored in storage unit 303 of server device 300 and perform an operation to input estimation information. This estimation information includes, for example, an order number, a serial number, order information, a product name, quantity, material information, processing information, a drawing scale, and work processes.

In step S15, input terminal 200 transmits the estimation information to server device 300. In step S16, storage control means 317 of server device 300 stores the estimation information received from input terminal 200 in estimation management table 321. For example, if a client drawing with a drawing number "201" is selected, and estimation information is input that includes an order number "001", a serial number "101", a client name "client X", a delivery date "20XX/12/20", a product name "Sheet Metal Product O", and quantity "4", these pieces of information are associated with each other and stored in estimation management table 321 as shown in FIG. 3.

In step S17, acquiring means 312 of server device 300 generates an estimation drawing based on the client drawing stored in step S13. In the example shown in FIG. 6, estimation drawing 720 is generated by tracing FIG. 711 included in client drawing 710. For example, this tracing may be performed in accordance with an operation of tracing FIG. 711 performed on input terminal 200 by the operator, or may be performed by means of a line tracing technique that uses image processing.

In step S18, specifying means 313 of server device 300 specifies work elements of the work for producing the product based on the client drawing and the estimation information. In the example shown in FIG. 6, client drawing 710 shows work elements for producing the product in a predetermined format. Specifying means 313 specifies work elements by performing image recognition on FIG. 711 included in client drawing 710. Alternatively, specifying means 313 may specify work elements from production information 712 included in client drawing 710. The work elements include the location where work such as processing is performed during the work processes for producing the product, and the amount of work. For example, if the work processes include a welding process, the work elements include the number of welding locations and a welding length. If the work processes include a bending process, the work elements include a portion to be bent and a bending length.

In step S19, processing means 314 of server device 300 adds objects indicating the work elements specified in step S18 to the estimation drawing. A processed estimation drawing is thus generated. The estimation drawing has layers corresponding to the respective work processes. For example, if the work processes for producing the product includes a bending process and a welding process, estimation drawing 720 includes bending layer 722 corresponding to the bending process and welding layer 723 corresponding to the welding process, in addition to original image layer 721 on which the FIG. 711 is drawn, as shown in FIG. 6. Each layer includes an object that indicates the work content to be performed in the corresponding work process. The estimation drawing to which the objects are added is not only used to create an estimation but also serves as written work instructions that indicate the work content.

Figure 7:
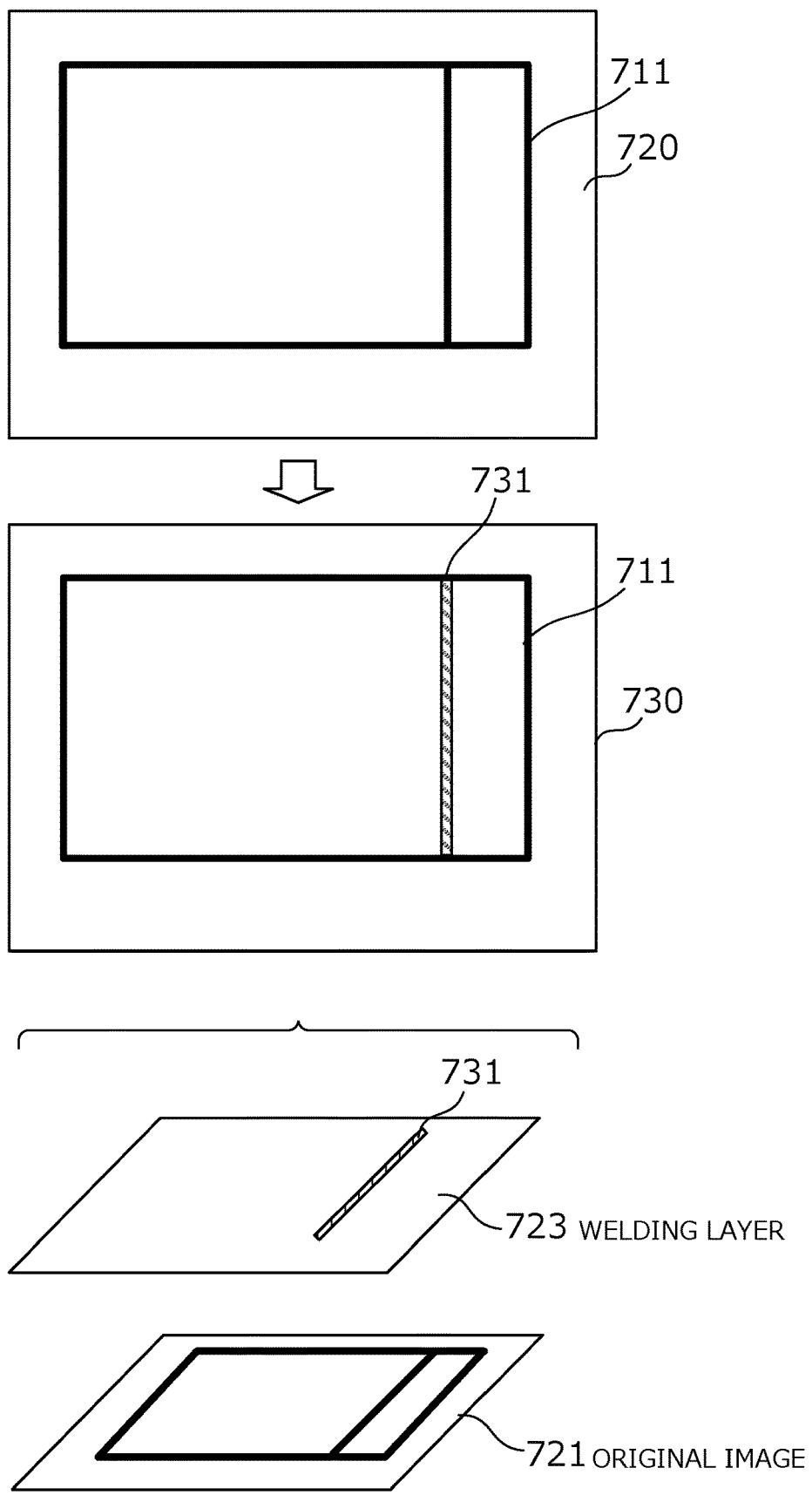
FIG. 7 shows an example of an object indicating work elements.

FIG. 7 shows an example of an object indicating a work element. Here, it is assumed that welding is performed at one location during the welding process. In this case, welding object 731 is added to welding layer 723 of estimation drawing 720, as shown in FIG. 6. Processed estimation drawing 730 is thus generated. Welding object 731 is, for example, a line that is different in color, line type, or thickness from lines that form FIG. 711. Welding object 731 may have a color such as red that is more prominent than that of FIG. 711, for example. As shown in FIG. 7, this welding object 731 is added to a welding target portion indicated by FIG. 711 in order to indicate the welding target portion. Welding object 731 may also have a different appearance depending on the welding type. For example, welding object 731 may have a different color, line type, or thickness between electric welding and laser welding.

In step S20, processing means 314 of server device 300 decomposes the processed estimation drawing by work process. For example, if the work processes include a welding process and a bending process, the decomposed estimation drawing includes an estimation drawing for the welding process and an estimation drawing for the bending process. The estimation drawing for the welding process has welding layer 723 on top of original image layer 721, as shown in FIG. 7. The estimation drawing for the bending process has bending layer 722 on top of original image layer 721. The thus-generated estimation drawings for the respective work processes are stored in storage unit 303.

In step S21, calculating means 315 of server device 300 calculates an estimated number of man-hours and an estimated amount of the work for producing the product, based on the processed estimation drawings and the estimation information. The estimated number of man-hours is the time required for the work for producing the product. The estimated number of man-hours is, for example, calculated in accordance with the work elements specified in step S18, by referencing the time required for the work for each work element that is stored in advance in storage unit 303. The estimated amount includes a material cost, a work cost, and a purchase cost. The material cost is the cost of materials of the product. For example, the material cost is calculated in accordance with the materials determined based on the size, material quality, and thickness of the product, by referencing the cost of each material that is stored in advance in storage unit 303. The size of the product may be specified from the estimation drawing, for example. The work cost is the cost of the work required for the processes necessary for producing the product, such as bending and welding. For example, the work cost is calculated in accordance with the estimated number of man-hours by referencing the work cost per unit of time that is stored in advance in storage unit 303. The purchase cost is the cost of purchasing commonly distributed general-purpose members, such as nuts and screws, that are necessary for producing the product. The purchase cost is calculated in accordance with the general-purpose members required to produce the product by referencing the cost of each general-purpose member that is stored in advance in storage unit 303, for example. The general-purpose members necessary for producing the product may be specified from the estimation drawing, for example. In addition to the material cost, the work cost, and the purchase cost, the estimated amount may also include a predetermined indirect cost.

In step S22, storage control means 317 of server device 300 stores the estimated number of man-hours and the estimated amount calculated in step S20 in estimation management table 321. For example, if the estimated number of man-hours is "15" and the estimated amount is "30,000" yen, this information is stored in association with the drawing number "201", as shown in FIG. 3.

In step S23, generating means 316 of server device 300 generates an encoded image that indicates the serial number corresponding to the estimation drawing at a predetermining timing, and adds the generated encoded image to item tag data that indicates the item tag. This encoded image 751 is generated by encoding the serial number, for example.

Figure 8:
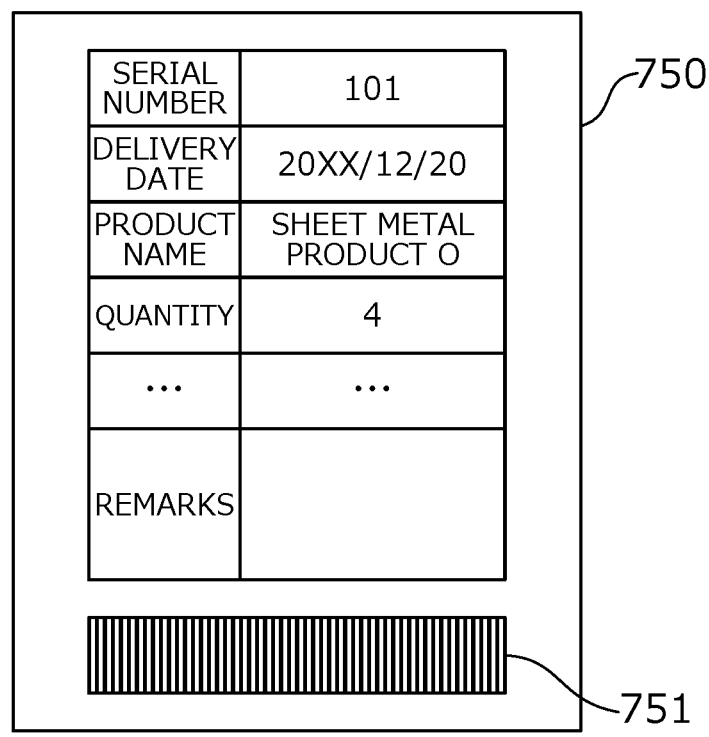
FIG. 8 shows an example of an item tag.

FIG. 8 shows an example of item tag 750. Item tag 750 is a slip attached to the material of the product. Item tag 750 includes, for example, the serial number "101", the delivery date "20XX/12/20", the product name "Sheet Metal Product O", and the quantity "4", which are included in estimation management table 321 shown in FIG. 3. Item tag 750 also includes encoded image 751 that indicates the serial number "101".

In step S24, output means 318 of server device 300 transmits a print instruction, i.e. an instruction to print the item tag, to image processing device 100. This print instruction includes the item tag data.

In step S25, image processing device 100 prints the item tag in accordance with the print instruction received from server device 300. For example, item tag 750 shown in FIG. 8 is printed. The thus-printed item tag is attached to the material of the product together with the production drawing, and is brought to operator of each work process. Note that the production drawing is created separately from the estimation drawing based on the client drawing.

Figure 9:
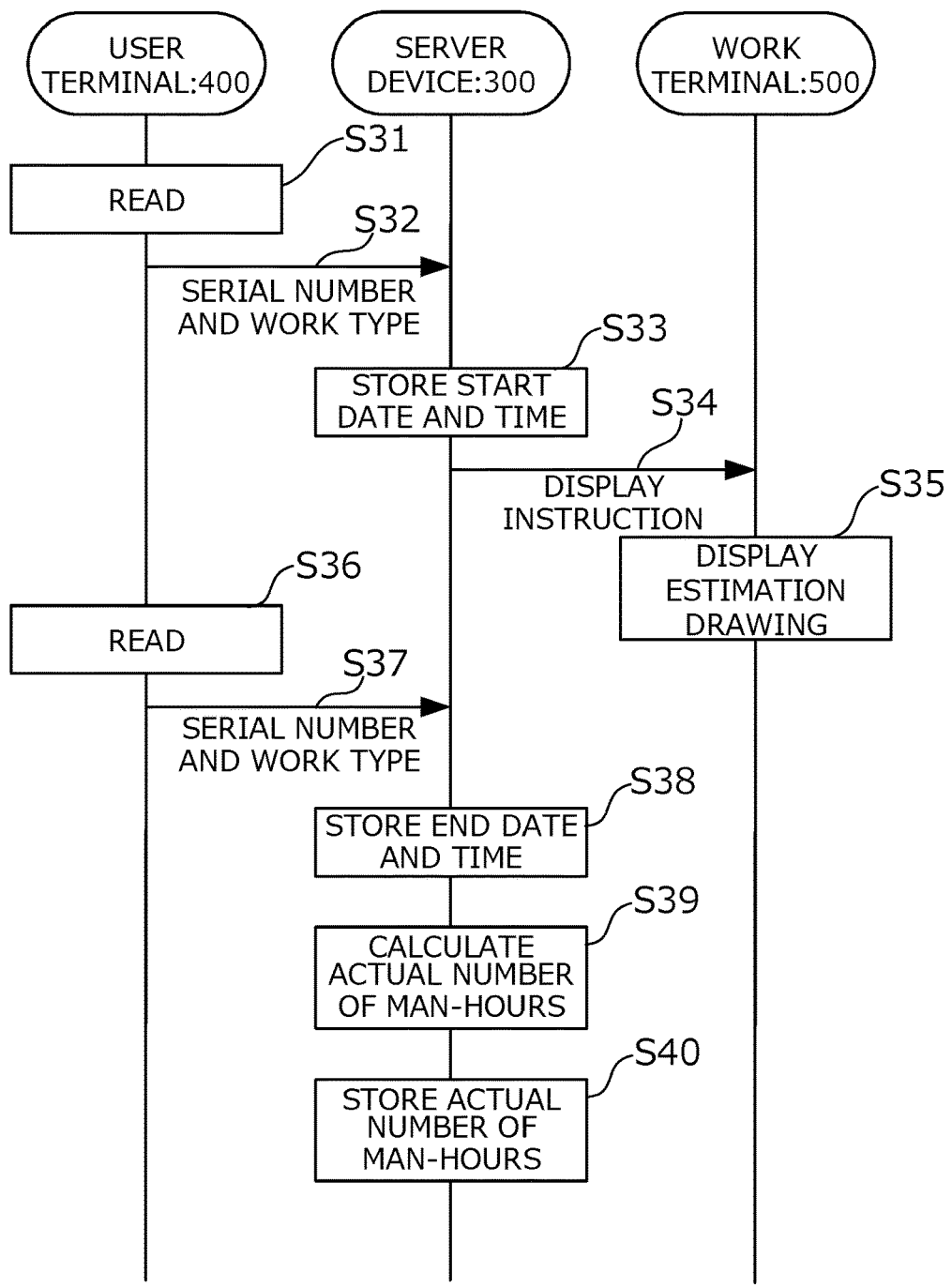
FIG. 9 is a sequence chart showing an example of operation performed when a product is produced.

FIG. 9 is a sequence chart showing an example of operation of estimation system 10 when an operator produces a product. A set of the material, the item tag, and the production drawing of the product is brought to the operator. In step S31, when starting the work, the operator reads the encoded image added to the item tag using user terminal 400. For example, user terminal 400 first captures encoded image 751 included in item tag 750 shown in FIG. 8, using image capture unit 401. Next, user terminal 400 decrypts captured encoded image 751 and obtains the serial number. In step S32, user terminal 400 transmits this serial number and the work type that the operator is to perform, to server device 300. Here, the work type is stored in advance in the storage unit of user terminal 400. For example, if user terminal 400 is used by an operator of the welding process, the work type, which is "welding", is stored in advance in the storage unit of user terminal 400, and is read and transmitted.

In step S33, storage control means 317 of server device 300 stores, as the start date and time of the work, the date and time when the encoded image is first read in schedule management table 322. The date and time when the serial number is received may be used as the date and time when the encoded image was first read. For example, if encoded image 751 shown in FIG. 8 is first read on "20XX/12/10 10:10" and the serial number named "101" and the work type "welding" are received from user terminal 400, the start date and time "20XX/12/10 10:10" is stored in association with the serial number "101" and the work type "welding", as shown in FIG. 4.

In step S34, output means 318 of server device 300 transmits a display instruction, i.e. an instruction to display the estimation drawing of the corresponding work process, to work terminal 500 associated with user terminal 400 that has read the encoded image. Here, it is assumed that user terminal 400 is used by the operator who performs work of the welding process. In this case, an instruction to display the estimation drawing for the welding process is transmitted to work terminal 500A installed at the work site where the welding process is performed. This display instruction includes the estimation drawing for the welding process. The estimation drawing for the welding process is a drawing obtained by superimposing only welding layer 723 on original image layer 721, as shown in FIG. 7.

In step S35, work terminal 500 displays the estimation drawing received from server device 300 on display unit 501. For example, estimation drawing 730 shown in FIG. 7 is displayed on work terminal 500A installed at the work site for the welding process. As shown in FIG. 7, welding object 731 that indicates a welding location is displayed on estimation drawing 730. This enables the operator who performs welding to easily understand the welding location and the welding length by looking at this estimation drawing 730. Note that estimation drawing 730 is only for estimation, and the accuracy of the drawing is not necessarily high. For this reason, the actual welding work is performed based on the production drawing, rather than estimation drawing 730.

Here, although there are cases where the estimation for the work differs from the actual work content, the operator can recognize the difference between the estimation for the work and the actual work content by looking at the object added to estimation drawing 730. If the estimation for the work differs from the actual work content, the operator may also inform the person in charge of the order-accepting process of the difference. This makes it possible to revise the content of the estimation and create an estimation for work that matches the actual work content at the time of the next order.

After the work is finished, in step S36, the operator again reads the encoded image added to the item tag using user terminal 400, as in step S31 above. In step S37, user terminal 400 transmits the serial number and the type of this work acquired from the encoded image in step S36 to server device 300.

In step S38, storage control means 317 of server device 300 stores, as the end date and time of the work, the date and time when the encoded image is read again in schedule management table 322. The date and time when serial number is received again may be used as the date and time when the encoded image is read again. For example, if encoded image 751 shown in FIG. 8 is read again on "20XX/12/10 10:16" and the serial number named "101" and the work type "welding" are received from user terminal 400, the end date and time "20XX/12/10 10:16" is stored in association with the serial number "101" and the work type "welding".

In step S39, calculating means 315 of server device 300 calculates the actual number of man-hours in accordance with the start date and time and the end date and time. For example, if the start date and time is "20XX/12/10 10:10" and the end date and time is "20XX/12/10 10:16" as shown in FIG. 4, the time from the start date and time to the end date and time, namely "6", is calculated as the actual number of man-hours.

In step S40, storage control means 317 of server device 300 stores the actual number of man-hours calculated in step S39 in schedule management table 322. For example, the number of actual man-hours, namely "6", is stored in association with the serial number "101" and the work type "welding", as shown in FIG. 4.

The information included in schedule management table 322 may be displayed on work terminals 500 or user terminal 400 in response to an operation performed by an administrator, for example. This allows the administrator to understand the work schedule and the work results of each operator.

According to the above-described embodiment, the work content is indicated by an object added to the estimation drawing, thus allowing the operator to understand the work content more easily. In addition, the estimation drawing is used not only to create an estimation but also as written work instructions, and the estimation drawing is thus used effectively.

Variations

The present invention is not limited to the above-described embodiment. The above-described embodiment may also be varied as follows for implementation. Here, two or more of the following variations may be combined.

In the above-described embodiment, the method for processing the estimation drawing is not limited to the addition of an object. For example, at least any of the color, thickness, and type of lines of a figure included in the estimation drawing may be changed.

In the above-described embodiment, the encoded image need not necessarily be read when work is finished. For example, the date and time when, after a first encoded image has been read, a second encoded image is read may be used as the end date and time for work corresponding to the first encoded image.

In the above-described embodiment, the trigger to display the estimation drawing on work terminal 500 is not limited to the reading of the encoded image. For example, if the work schedule is displayed on user terminal 400, the estimation drawing may be displayed on work terminal 500 in response to an operation indicating the start of work being performed by selecting the work to be started from the schedule. In this variation, when this operation is performed, server device 300 is notified of the operation and transmits a display instruction that includes the estimation drawing to work terminal 500.

In the above-described embodiment, each drawing is not necessarily limited to a two-dimensional drawing, and may alternatively be a three-dimensional drawing. In the case of a three-dimensional estimation drawing as well, an object that indicates a work element is also added to a portion to be subjected to the work.

In the above-described embodiment, server device 300 may also include any other hardware element, or some hardware elements of server device 300 may be included in any other device. At least one of the functions of server device 300 may be realized by any other device.

Another mode of the present invention may be provided as a program to be executed by image processing device 100, input terminal 200, server device 300, user terminal 400, or work terminal 500. This program may be provided in a state recorded on a computer-readable recording medium, or may be downloaded via the Internet or any other communication line.

In the above-described embodiment, estimation information may also be added to the estimation drawing. The estimation information refers to information used to calculate an estimated amount. Examples of the estimation information include a detailed work type that is the premise and condition of estimation, a work method, work content, a work procedure, a set value to be used in the work, or the like. In the case of work of a welding process, the detailed work type includes a welding type, such as laser welding or spot welding. The set value includes a welding current value. In the case of work of a finishing process, the detailed work type includes a finishing type, such as mirror finishing. Here, it is assumed that an estimator creates an estimate. In this case, the estimation information is input to server device 300 in accordance with an operation of input terminal 200 performed by the estimator, for example. Here, an example is described where the estimation information includes text information "laser welding, welding current value A1" with respect to welding indicated by welding object 731 in FIG. 7. In this case, the text information "laser welding, welding current value A1" is added near welding object 731 in welding layer 723. Displaying this information enables the operator to recognize the estimation information regarding the work that the operator is in charge of.

In addition, cautionary information may also be added to the estimation drawing. Here, it is assumed that the cautionary information for each work process is stored in storage unit 303 of server device 300. In this case, the cautionary information for each work process may be added to the estimation drawing for the corresponding work process. Displaying this information enables the operator to recognize the cautionary information regarding the work that the operator is in charge of.

Furthermore, if the work content indicated by the estimation information differs from the actual work content, an operator's comment may be input in accordance with an operation of user terminal 400 or work terminal 500 performed by the operator. For example, if the detailed work type included in the estimation information is spot welding but laser welding is performed during the actual work, a comment on this difference may be input. The estimator can view this comment displayed on input terminal 200. Thus, when the work content indicated by estimation information differs from the actual work content, the estimator can realize that the work content assumed at the time of estimation was incorrect, as a result of feedback being given from the operator to the estimator. This enables the estimator to revise estimations to be created in the future, thus improving the estimation accuracy.

Further, the estimated number of man-hours may also be added to the estimation drawing. In this variation, the estimated number of man-hours is calculated for each work process. In the example shown in FIG. 7, the estimated number of man-hours in the welding process is added to welding layer 723. Displaying this estimated number of man-hours enables the operator to recognize the estimated number of man-hours.

Further, an alarm may be output if the actual work hours exceed an upper time limit that is determined in correspondence with the estimated number of man-hours. In this variation, the estimated number of man-hours is calculated for each work process. The upper limit time corresponding to the estimated number of man-hours is determined by server device 300. The upper limit time may be greater than the estimated number of man-hours. In one example, the upper limit time is a time obtained by multiplying the estimated number of man-hours by 110%. Note that the value by which the estimated number of man-hours is multiplied is not limited to 110% and may alternatively be a value greater or less than 110%. An alarm is output if the upper time limit elapses after the start date and time for the welding process is stored without the end date and time for this work being stored. Examples of the alarm output include display of an image, sound output, and a combination thereof on work terminal 500. The alarm may also be output from input terminal 200 used by the estimator. The output of the alarm enables the operator and the estimator to recognize that the actual work hours has exceeded the estimated number of man-hours. This allows the operator to perform work with awareness that work will be completed within the estimated number of man-hours. In addition, the estimator can find that the work content assumed at the time of estimation is incorrect. This enables the estimator to revise estimations to be created in the future, thus improving the estimation accuracy.

In the above-described embodiment, the work type may be input in accordance with an operation of user terminal 400 performed by the operator. In one example, user terminal 400 displays a screen to be used for an operation to select the work type. The work type is input by the operator performing the operation using this screen. In another example, the item tag includes a plurality of encoded images that indicate combinations of different work types and one serial number. For example, if the operator performs work of a welding process, the operator uses user terminal 400 to read an encoded image that indicates a combination of the work type of the welding process and the serial number, out of a plurality of encoded images. The work type may also be acquired in this manner.

Figure 10:
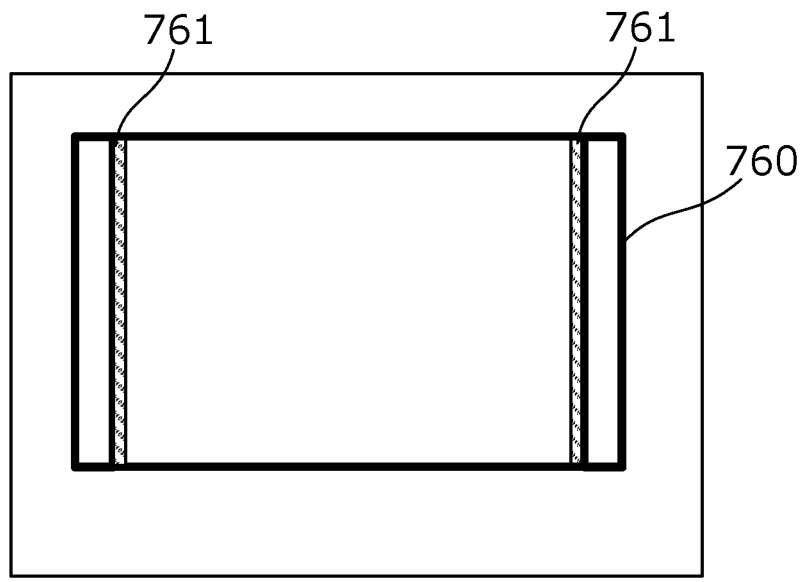
FIG. 10 shows an example of an estimation drawing according to a variation.
Figure 11:
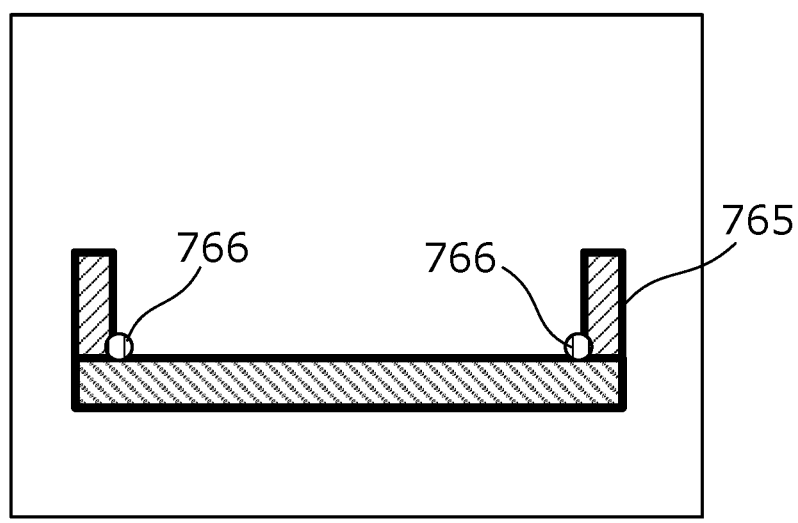
FIG. 11 shows another example of an estimation drawing according to a variation.

In the above-described embodiment, the estimation drawing is not limited to estimation drawing 730 shown in FIG. 7. The estimation drawing may be a three-view drawing, a six-view drawing, or at least either one of these drawings that better represents the work content. Here, it is assumed that the product produced through the work has a U-shape. In this case, a plan view is used as the estimation drawing as shown in FIG. 10, and welding objects 761 may be added to portions of FIG. 760 that are to be welded in this plan view. Alternatively, a cross-sectional view may be used as the estimation drawing as shown in FIG. 11, and welding objects 766 may be added to portions of FIG. 765 that are to be welded in this cross-sectional view. Welding objects 766 each have a circular shape. This indicates that the weld lines extend from the proximal side to the distal side of the paper along the depth direction. In this cross-sectional view, the weld lines extend from the proximal side to the distal side of the paper along the depth direction. Thus, welding objects 766 serve to indicate that the weld lines extend from the proximal side to the distal side of the paper along the depth direction, in addition to the portions to be welded. Note that the appearance of each welding object 766 is not limited to that shown in FIG. 11, and each welding object 766 may have any appearance.

In the above-described embodiment, the client drawing may be a three-dimensional drawing. In this case, the estimation drawing may be generated after the three-dimensional drawing is developed into a two-dimensional drawing using a known technique.

REFERENCE SIGNS LIST

10 Estimation system
100 Image processing device

200 Input terminal
300 Server device
311 Receiving means
312 Acquiring means
313 Specifying means
314 Processing means
315 Calculating means
316 Generating means
317 Storage control means
318 Output means
400 User terminal
500 Work terminal

The invention claimed is:

1. A server device comprising:
one or more processors programmed to:
acquire, from a client terminal, a two-dimensional drawing to be used in estimation related to work for producing a product;
process the drawing by:
converting the two-dimensional drawing into a digital format;
performing an image recognition processing on the drawing to recognize a work element included in the drawing; and
creating an object indicating content of work to be performed in a work process for producing the product and overlaying the created object onto the drawing, wherein:
the processed drawing includes a plurality of layers corresponding to each different work process to be performed which are overlaid onto the drawing, and each layer includes a respective object created to indicate the respective content of work to be performed in the respective work process, and
the respective object indicates at least a target location in the product where the respective work process needs to be performed, in order to serve as a visual instruction for an operator performing the respective work process;
generate an encoded image in association with the processed drawing;
cause a printer to print the encoded image on a print medium;
determine that a user terminal has read the encoded image printed on the print medium; and;
upon determining that the user terminal has read the encoded image,
select a layer, from the plurality of layers, which corresponds to work process information pre-stored in the user terminal, and
automatically output the selected layer among the plurality of layers to a terminal device located at a work site where the work process indicated in the user terminal is to be performed.

2. The server device according to claim 1, wherein the object indicates a portion to be subjected to the work.

3. The server device according to claim 1, wherein the respective object has an appearance that is different depending on a type of the respective content of work indicated therein.

4. The server device according to claim 1, wherein the one or more processors output a drawing obtained by superimposing, on the acquired drawing, the selected layer including the object indicating the content of work to be performed, to the terminal device associated with the work process indicated in the user terminal, out of a plurality of terminal devices.

5. The server device according to claim 1, wherein the generated encoded image indicates an identifier that uniquely identifies production of the product.

6. The server device according to claim 5, wherein the one or more processors are further configured to:
store, in a memory, at least one of start date and time of the work and end date and time of the work, based on date and time when the encoded image is read by the user terminal.

7. The server device according to claim 1, wherein the user terminal that has read the encoded image is a smartphone.

8. The server device according to claim 1, wherein the one or more processors are further configured to print an item tag with the encoded image on a sheet, and the item tag is to be attached to a material of the product.

9. A non-transitory computer readable medium storing a program for causing a computer to execute:
acquiring, from a client terminal, a two-dimensional drawing to be used in estimation related to work for producing a product;
processing the drawing by:
converting the two-dimensional drawing into a digital format;
performing an image recognition processing on the drawing to recognize a work element included in the drawing; and
creating an object indicating content of work to be performed in a work process for producing the product and overlaying the created object onto the drawing, wherein:
the processed drawing includes a plurality of layers corresponding to each different work process to be performed which are overlaid onto the drawing, and each layer includes a respective object created to indicate the respective content of work to be performed in the respective work process, and
the respective object indicates at least a target location in the product where the respective work process needs to be performed, in order to serve as a visual instruction for an operator performing the respective work process;
generating an encoded image in association with the processed drawing;
causing a printer to print the encoded image on a print medium;
determining that a user terminal has read the encoded image printed on the print medium; and
upon determining that the user terminal has read the encoded image,
selecting a layer, from the plurality of layers, which corresponds to work process information pre-stored in the user terminal, and
automatically outputting the selected layer among the plurality of layers to a terminal device located at a work site where the work process indicated in the user terminal is to be performed.

* * * * *